United States Patent
Moriuchi et al.

[11] Patent Number: 5,957,736
[45] Date of Patent: Sep. 28, 1999

[54] ELECTRONIC PART

[75] Inventors: Hiroyuki Moriuchi; Tomonari Otsuki; Sadao Kuboi, all of Tokyo; Kiyoshi Matsui, Hadano; Takayuki Ono, Hadano; Morio Suzuki, Hadano, all of Japan

[73] Assignees: DDK Ltd.; Hitachi, Ltd., both of Japan

[21] Appl. No.: 08/987,196

[22] Filed: Dec. 8, 1997

[51] Int. Cl.[6] ................................................. H01R 4/02
[52] U.S. Cl. ........................................... 439/876; 439/886
[58] Field of Search .................................. 439/876, 886; 228/215

[56] References Cited

U.S. PATENT DOCUMENTS

| | | | |
|---|---|---|---|
| 3,230,297 | 1/1966 | Means | 174/68.5 |
| 3,989,331 | 11/1976 | Hanlon | 339/17 CF |
| 5,105,260 | 4/1992 | Butera | 357/74 |
| 5,162,171 | 11/1992 | Jones | 429/101 |
| 5,453,017 | 9/1995 | Belopolsky | 439/886 |

FOREIGN PATENT DOCUMENTS

A 582201  4/1993  Japan .

*Primary Examiner*—Ren Yan
*Attorney, Agent, or Firm*—Silverman, Cass & Singer, Ltd.

[57] ABSTRACT

An electronic part, particularly a microstructure contact having an overall length of the order of 5 mm for an electrical connector or the like is provided with a nickel oxide layer portion having a nickel oxide layer of the order of 50 to 5000 Å in thickness formed by anode oxidizing process using a solution mainly consisting of an alkaline solution. The nickel oxide layer portion is located between a terminal portion of the electronic part to be soldered as in a surface mounting process and a contact portion continuous to and extending from the terminal portion. The nickel oxide layer has a width of the order of 0.2 to 1 mm in the longitudinal direction of the contact and has a performance preventing the flowing of molten solder, thereby effectively preventing the flowing and wicking due to wetting of solder of the solder-plated portion toward the other portions as in the surface mounting process.

20 Claims, 3 Drawing Sheets

FIG._2
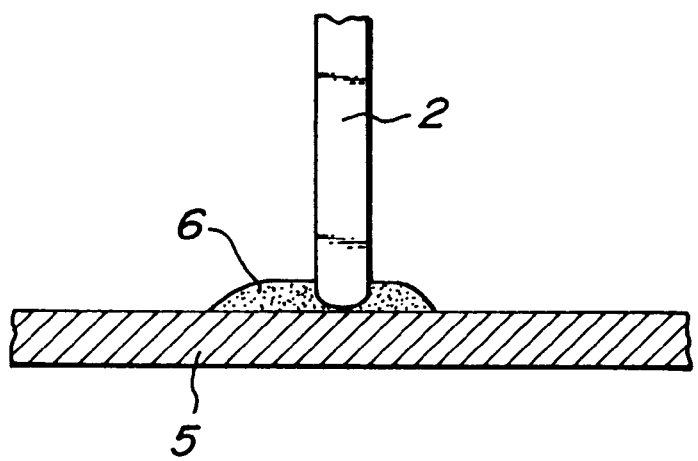
FIG._3
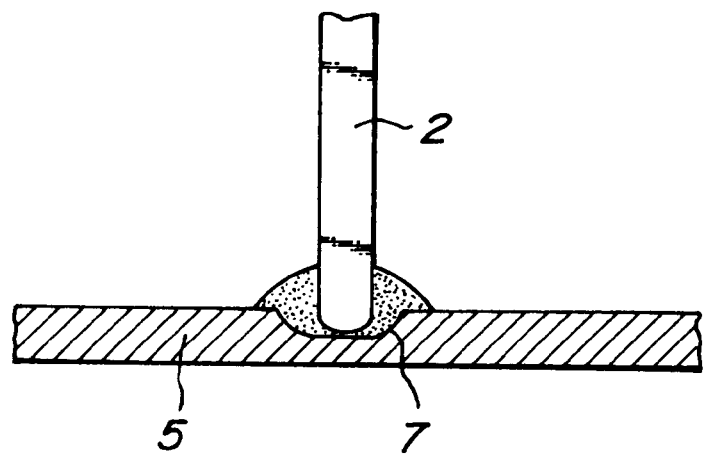

ELECTRONIC PART

BACKGROUND OF THE INVENTION

This invention relates to an electronic part, for example, a contact for an electrical connector, lead frame or the like, and more particularly to a microelectronic part having a component portion, for example, terminal portion which is plated with solder or adapted to abut against a portion plated with solder, the electronic part being capable of preventing the flowing or wicking of the solder due to wetting toward another component portion, for example, a contact portion of the electronic part in a later process, for example, surface mounting process.

The term "wicking" as used herein is intended to designate the upward flowing of molten solder due to wetting, as if it were a melt wax rising along a wick with capillary action.

In many cases, terminals of a circuit board are electrically connected by means of soldering to electronic parts, for example, contacts of electrical connectors equipped on the board.

Such an electrical connector usually has contacts as connecting parts. In general, the contact is formed of a metal plate by means of punching, bending and the like. The contact portion of the contact is usually plated for electric contact to improve its corrosion resistance and electric conductivity. On the other hand, the terminal portion of the contact, which is formed continuously with the contact portion, is usually plated with a metal required for soldering in order to perform the reliable soldering or to improve the adhesion in soldering in a later process. The metal for plating the terminal portion is usually solder, but it may be gold (Au), palladium-nickel (Pd—Ni), palladium (Pd) or tin (Sn) as the case may be. This plated portion is referred to hereinafter as a "plated portion for soldering" or "portion plated for soldering".

There is disclosed in Japanese Patent Application Opened No. H5-82,201 opened on Apr. 2, 1,993 a formation of copper oxide film by treating copper or copper alloy by means of the anode oxidizing process using an acidic solution in order to prevent a solder bridge. In this known technique, using a phosphor bronze of 0.2 mm in thickness and 20 mm in width as a blank material, after application of masking tapes, photo-resist or rubber-like tapes onto partial portions of the blank material, the material is selectively plated to obtain a gold-plated belt-shaped portion having a 4 mm width and a solder-plated belt-shaped portion having a 10 mm width. Thereafter, masking tapes, photo-resist or rubber-like tapes are again applied onto required portions of the blank material and then treated by the anode oxidizing process to form the copper oxide film.

In the microelectronic part concerned with the present invention, however, such a process of the prior art is troublesome and time-consuming, which could not be practically used.

In a hitherto used contact of an electrical connector, the gold plating and plating for soldering have been separately applied to the contact and terminal portions of an electronic part. With miniaturization of electronic appliances, however, electrical connectors have also been required to be miniaturized and hence the contacts used therein have also been miniaturized.

The present invention is directed to a microelectronic part of which length is of the order of several mm.

Consequently, with such a small sized contact having a gold-plated portion and a plated portion for soldering separately applied, a problem arises with the operation for electrically connecting the terminal portion of the contact to a terminal portion of a circuit board, for example, with the surface mounting technique. In more detail, the molten solder from the circuit board and the solder-plated portion of the contact would flow and rising (the so-called "wicking") in extreme case through the terminal portion of the contact to the contact portion, so that the flowing solder will contaminate the gold-plated contact portion of the contact.

In order to overcome this problem, it have been found that a nickel layer provided between the gold-plated contact portion and the terminal portion plated for soldering can prevent the flowing or wicking of molten solder toward the contact portion due to wetting in the surface mounting process, and the application of such a nickel layer has been practically used.

In this case, it is needed for the nickel layer to have a width sufficient to prevent the flowing and wicking of the molten solder due to wetting. With a miniaturized contact, for example, of the order of 5 mm in overall length, however, it will become to difficult to provide a nickel layer having a width sufficient to prevent the flowing or wicking of molten solder due to wetting in a reliable manner, because of its extremely narrow space. Therefore, the performance of the nickel layer for preventing the flowing and wicking of solder could not be effectively utilized.

SUMMARY OF THE INVENTION

In view of the disadvantages of the prior art described above, it is an object of the invention to provide an electronic part such as a contact having a molten solder flowing prevention portion or layer which, in the surface mounting process or the like, can effectively prevent the flowing or wicking due to wetting of molten solder on the side of a terminal portion toward another portion such as a contact portion of the contact, although the contact is very small which is of the order of 5 mm in length or less.

The above object is accomplished by the electronic part of an electrical connector or the like according to the invention which comprises a nickel oxide layer portion formed by anode oxidizing process using a solution mainly consisting of an alkaline solution, said nickel oxide layer portion being located between a component portion which has been plated for soldering and is to abut against a soldering material and another component portion continuous to and extending from the component portion.

The electronic part (contact or the like) of an electrical connector or the like according to the invention comprises a nickel oxide layer portion between a component portion to be plated with solder in the surface mounting process or the like and another component portion continuous to and extending from the first mentioned component portion, and the nickel oxide layer of the nickel oxide layer portion has a higher performance for preventing the flowing and wicking of molten solder than in a nickel layer of the prior art, even with a less width (area) of the nickel oxide layer portion. Accordingly, even if the electronic part according to the invention is considerably small of the order of 5 mm or less, it can effectively prevent the flowing and wicking of the molten solder due to wetting in a later process such as the surface mounting process.

In other words, the present invention can provide a microelectronic part having a solder flowing prevention performance, which is so small that the flowing or wicking of molten solder could not be effectively controlled in the prior art.

According to the invention the surface of a nickel layer can be oxidized, while removing very thin films (contaminants) of plating layer. The "very thin film" used herein means a plating layer of a metal other than nickel (for example, gold, palladium, solder or the like) which is situated at a location where such a plating is inherently prohibited. Particularly, with a miniaturized contact, the space between plated regions of contact and terminal portions separately plated becomes very narrow so that the plated metals of the contact and terminal portions tend to extend to the very narrow space, resulting in a contamination.

Inherently, the plated nickel is likely to be oxidized and has a tendency to keep clear of solder. In the event that the "thin film" described above has located on the surface of the nickel layer, however, the nickel itself is combined with the thin film without being oxidized. When this combined matter is heated and contacts the molten solder, the thin film will diffuse into the molten solder so that the solder becomes under its wetting condition resulting from the combination with the nickel. Such wetting condition will give rise to the undesirable results described above.

The present invention has also the effect removing the contaminated plating matters.

The invention will be more fully understood by referring to the following detailed specification and claims taken in connection with the appended drawings.

BRIEF DESCRIPTION OF THE DRAWINGS

FIG. 2 is a partly longitudinal-sectional view illustrating a soldering state between a substrate and a contact of another embodiment according to the invention;

FIG. 3 is a partly longitudinal-sectional view illustrating a soldering state between a substrate and a contact of a further embodiment according to the invention.

DESCRIPTION OF THE PREFERRED EMBODIMENTS

Figure 1:
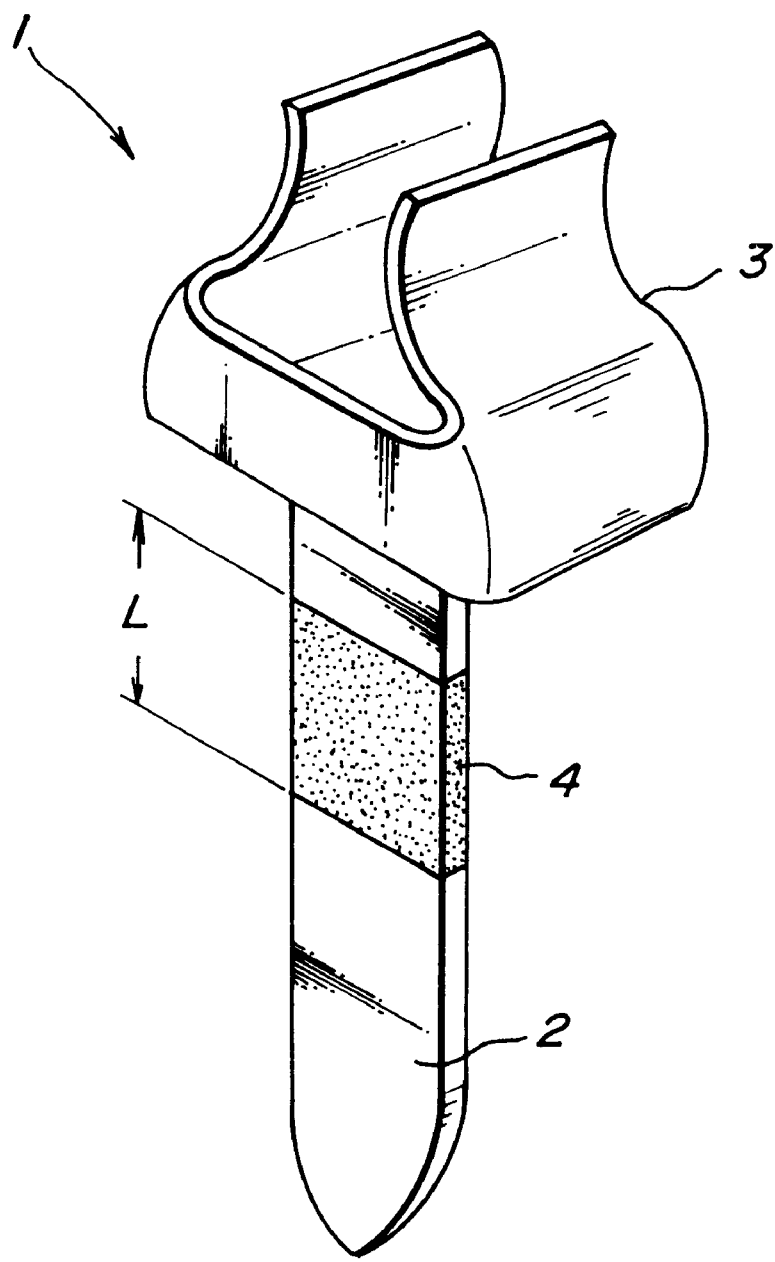
FIG. 1 is a perspective view illustrating a contact of an electrical connector as the electronic part according to the invention.

FIG. 1 illustrates a contact of an electrical connector as an electronic part, to which the present invention is applied, such a contact being in general mounted in a housing or block of the connector.

The contact shown in the drawing is formed of a metal plate. In brief, the contact 1 is composed of a terminal portion 2 plated for soldering described above, a contact portion 3 plated with gold and continuous to and extending from the terminal portion 2, and a nickel oxide layer portion 4 provided between the portions 2 and 3. The terminal portion 2 is usually plated with solder for the purpose of improving the adhesion in soldering and the plating layer is very thin. It may be plated with gold, palladium, palladium-nickel, tin or the like.

The contact portion 3 has a shape of, but is not limited to, twin leaves or a pin-socket and is adapted to be brought into contact with a contact of a mating electrical connector.

Figure 4:
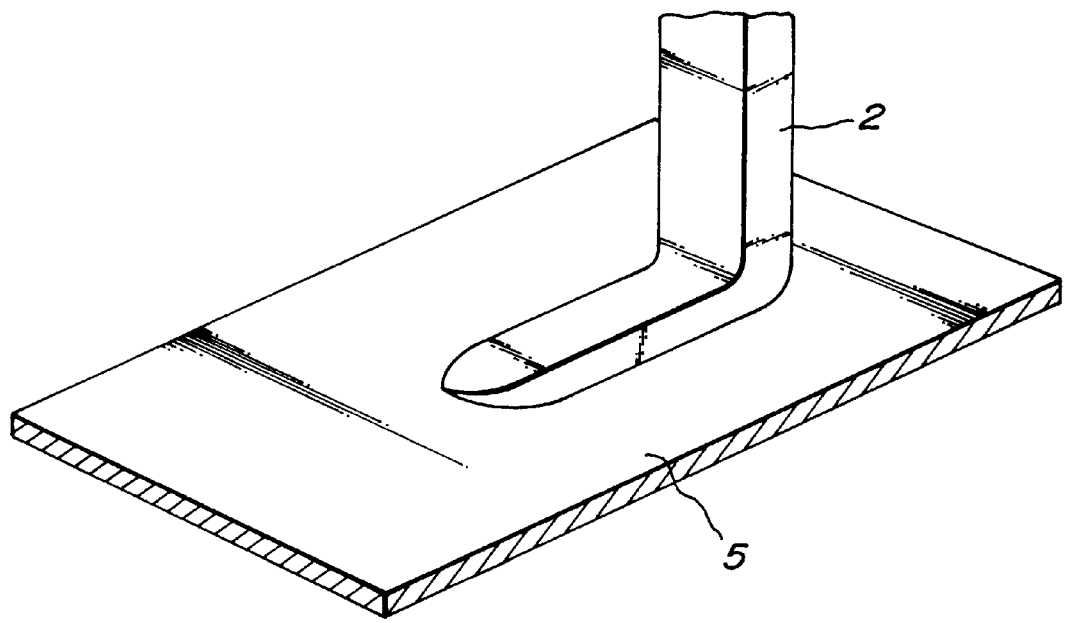
FIG. 4 is a partial perspective view illustrating a soldering state between a substrate and a contact of a still further embodiment according to the invention.

On the other hand, the terminal portion 2 is usually in the form of a bar having a sharp distal end which is frequently inserted into a through-hole provided at one of terminals of a circuit board and attached thereto by soldering. As shown in FIGS. 2 and 3, for example, a terminal portion 2 having a flat end may be used, which is brought into abutment against a solder pat 6 on a substrate 5 or in a soldering recess 7 formed in a substrate and attached thereat by soldering. The terminal portion 3 is not necessarily straight, and may be bent as shown in FIG. 4.

The material of the contact 1 according to the invention may be any one of the materials generally used for contacts of electrical connectors and the like, which is not limited to a particular material. In forming the contact 1 according to the invention, as described above a metal plate (a plate-shaped metal for contacts) is generally punched by press-forming into a predetermined shape of a blank contact which is then further worked by bending, drawing or the like.

Thereafter, the contact 1 is plated with solder for later soldering on its bar-shaped portion which becomes the terminal portion 2 and is further plated usually with gold on the portion which becomes the contact portion 3. A nickel oxide layer portion 4 is formed between these portions 2 and 3 of the contact. In forming the nickel oxide layer portion 4, a nickel layer is previously provided on the relevant portion of the contact. Before the plating with the solder and gold on the portions 2 and 3, a nickel layer may be applied as a primary or base layer over the portions 2 and 3 or from the terminal portion 2 to the proximity of the contact portion 3. The base nickel layer is then oxidized to form the nickel oxide layer portion 4 of the contact 1.

The nickel oxide layer portion 4 has a width L in the direction of the length of the contact, which is not less than 0.2 mm. The width L not less than 0.2 mm is employed for the following reason. With the width L less than 0.2 mm, when the contact portion is being plated with gold, a gold plating treatment liquid will penetrate into the nickel layer as the base layer between the contact portion 3 and the terminal portion 2 to contaminate the nickel layer (frequently causing the gold to be separated). With such a contamination, the oxidization of the nickel layer could not be effected under a good condition, making it impossible to obtain the desired nickel oxide layer portion 4.

The insufficient oxidization of the nickel layer would adversely affect the soldering of the terminal portion 2 of the contact 1 onto a predetermined location of a substrate in a post-processing such as surface mounting process. In more detail, the molten solder from the substrate mainly and the molten solder for soldering the terminal portion 2 tend to flow or rising up (the so-called "wicking") along the terminal portion 2 toward the contact portion 3, due to the fact that the flowing prevention performance of the solder has been lowered by the insufficient oxidization of the nickel layer.

The base nickel layer for forming the nickel oxide layer portion 4 needs only to have a sufficient thickness for preventing it from being damaged by unintentional scraping, for example, 0.5 μm. The actual thickness of nickel oxide layer itself is just in an order of 50–5000 Å. A base nickel layer having a thickness thinner than 0.5 μm may cause the risk of the metal layer as a base layer to be partially exposed out of the oxide layer and may reduce the effect for preventing the flowing and wicking of molten solder due to wetting. On the other hand, a too thick nickel oxide layer of such as a few μm will increase the cost without improving the effect preventing the flowing or wicking of the solder due to wetting. Preferably, the thickness of the nickel oxide layer is of the order of 0.5 to 3 μm in view of the cost.

In forming a nickel oxide layer portion 4 by oxidizing the nickel layer, according to the invention the anode oxidizing process is used with a solution mainly consisting of an alkaline solution to obtain a significant effect.

Good results were obtained in the experience carried out by the inventors of the present application under the following conditions.

(1) The alkaline solution was selected from the following solutions.

sodium metasilicate
potassium hydroxide
ammonium hydroxide
calcium hydroxide
sodium hydroxide
sodium fluoride In this case, the above solution may be added with a surface-active agent, an oxidizing agent, or organic acid salts as the case may be.

| (2) current density | 1.0 to 10.0 A/dm$^2$ |
| --- | --- |
| (3) treating time | 2 to 30 seconds |
| (4) solution temperature | 30 to 60° C. |

By selecting the treating solution and treating conditions in the manner described above according to the invention, the undesirable soldering contamination is completely prevented and simultaneously the nickel layer can be effectively oxidized. As described above, the soldering contamination is caused by droplets of gold plating treatment liquid or the like in gold plating, which are attached to the place where soldering is inherently prohibited, to form a very thin contaminant which will adversely affect the flowing prevention performance of the solder.

According to the invention the anode oxidizing method using a solution mainly consisting of an alkaline solution is employed for the following reasons. In the plating processes for plating the terminal portion 2 for soldering and plating the contact portion 3 with gold, the gold plating treatment liquid oozes at the nickel layer as the base layer so that separated thin gold layers solve into an anode oxidizing treatment liquid in the anode oxidizing process to remove the undesirable gold plating contaminant, thereby obtaining nickel oxide layer surfaces in higher purity and improving the effect preventing the flowing and wicking of solder due to wetting.

EXAMPLE

A metal plate of a 0.1 mm thickness of beryllium copper equivalent to JIS (Japanese Industrial Standard)-C-1720R was punched and bent to obtain contacts (formed products) each having a contact portion of 2.0 mm in length and a terminal portion of 2.0 mm in length. The contact was plated with nickel to form nickel layers of approximately 1.6 $\mu$m in thickness on its contact and terminal portions. Then, the contact portion was plated with gold to 0.4 $\mu$m in thickness and the terminal portion was plated with gold for soldering to 0.05 $\mu$m in thickness, leaving a space of approximately 0.3 mm in width therebetween.

Thereafter, the nickel layer exposed between the contact and terminal portions was oxidized with the anode oxidizing process using solution mainly consisting of an alkaline chemical to form a nickel oxide layer (a barrier for preventing the flowing and wicking of the solder).

One hundred samples of the contacts according to the invention were obtained in this manner. The terminal portions of the contacts were immersed in a bath of molten solder to observe the state of the molten solder rising due to wetting. The results are shown in Table 1 which also shows the results of prior art contacts (Comparative Examples 1 and 2) having nickel layers which have not been oxidized or having no nickel layers. The indication "MIL-STD" in the Table 1 designates a method for evaluating the wettability of a solder in which after a sample to be tested has been coated with a flux, the sample is immersed into molten solder at about 230° C.

As can be seen from the Table 1, with all the samples of the contacts according to the invention, the molten solder did not arrive at gold-plated areas of contact portions beyond the nickel oxide layers. In contrast herewith, with substantially all the contacts (respectively one hundred) of prior art (Comparative Examples 1 and 2) having no nickel oxide layers, the wicking of solder due to wetting has been observed, for lack of the effect preventing the molten solder from flowing and wicking due to wetting.

TABLE 1

| | Contacts according to the invention | Comparative Example 1 | Comparative Example 2 |
| --- | --- | --- | --- |
| Existence of nickel oxide layer portion | Yes | Nickel layer | No |
| State of sample contact | Nickel oxide layer is formed by electrolytically treating the plated nickel layer between contact and terminal portions, using the sample contact as an anode in an alkaline solution. | The plated nickel layer between contact and terminal portions is not processed by oxidizing treatment. | All the contact and terminal portions are plated with gold. |
| Method of test | MIL-STD | MIL-STD | MIL-STD |
| Wicking (number of sample contacts exhibiting wicking/total number of sample contacts) | 0/100 | 100/100 | 100/100 |

While the invention has been described in the above embodiments concerning contacts of an electrical connector, the invention is not limited thereto but may be applicable to other electronic parts which have to overcome the problem of flowing and wicking of solder due to wetting. Moreover, it will be understood by those skilled in the art that the foregoing and other changes in form and details can be made therein without departing from the spirit and scope of the invention.

What is claimed is:

1. An electronic part comprising a contact portion at one end thereof, a terminal portion at an opposite end thereof and a barrier portion therebetween contiguous with said contact portion and said terminal portion, said part including a coating thereon comprising nickel on at least said contact portion and said terminal portion, with a first overcoating on said contact portion to facilitate electrical contact and a second overcoating on said terminal portion to facilitate soldering of the part to a circuit board, said barrier portion comprising a coating of nickel which has been converted to a layer of nickel oxide by anodizing the nickel coating in an alkaline solution between said overcoated contact portion and said overcoated terminal portion, said barrier portion inhibiting migration of molten solder between said terminal portion and said contact portion.

2. An electronic part comprising a contact portion at one end thereof, a terminal portion at an opposite end thereof and a barrier portion therebetween contiguous with the contact portion and the terminal portion, said part including a coating thereon comprising nickel on at least said contact portion and said terminal portion, with a first overcoating on said contact portion and a second overcoating on said terminal portion, said barrier portion comprising a coating of nickel which has been converted to a layer of nickel oxide by anodizing the nickel coating in an alkaline solution between said overcoated contact portion and said overcoated terminal portion.

3. An electronic part as set forth in claim 2, wherein said nickel oxide layer has a width of 0.3 to 2.8 mm and a thickness of 50 to 5000 Å.

4. An electronic part as set forth in claim 3, wherein the barrier portion is formed by anodizing the nickel coating in an alkaline solution selected from the group consisting of sodium metasilicate, potassium hydroxide, ammonium hydroxide, calcium hydroxide, sodium hydroxide and sodium fluoride, under conditions of 1.0 to 10.0 A/dm$^2$ current density, 2 to 30 seconds treatment time and 30 to 60° solution temperature.

5. An electronic part as set forth in claim 3, wherein said contact portion is overcoated with a plated metal which facilitates electrical contact.

6. An electronic part as set forth in claim 3, wherein said terminal portion is overcoated with a metal plated to facilitate soldering and said contact portion is overcoated with a metal plated to facilitate electrical contact.

7. A electric circuit device comprising the electronic part as claimed in claim 3, soldered to a circuit board.

8. An electronic part as set forth in claim 2, wherein the barrier portion is formed by anodizing the nickel coating in an alkaline solution selected from the group consisting of sodium metasilicate, potassium hydroxide, ammonium hydroxide, calcium hydroxide, sodium hydroxide and sodium fluoride, under conditions of 1.0 to 10.0 A/dm$^2$ current density, 2 to 30 seconds treatment time and 30 to 60° solution temperature.

9. An electronic part as set forth in claim 8, wherein said terminal portion is overcoated with a metal plated to facilitate soldering and said contact portion is overcoated with a metal plated to facilitate electrical contact.

10. A electric circuit device comprising the electronic part as claimed in claim 8, soldered to a circuit board.

11. An electronic part as set forth in claim 2, wherein said contact portion is overcoated with a plated metal which facilitates electrical contact.

12. An electronic part as set forth in claim 11, wherein said nickel oxide layer has a width of at least 0.3 mm.

13. A electric circuit device comprising the electronic part as claimed in claim 12, soldered to a circuit board.

14. An electronic part as set forth in claim 11, wherein the contact portion is plated with gold.

15. An electronic part as set forth in claim 11, wherein said terminal portion is overcoated with a metal plated to facilitate soldering.

16. A electric circuit device comprising the electronic part as claimed in claim 11, soldered to a circuit board.

17. An electronic part as set forth in claim 2, wherein the terminal portion is overcoated with a metal plated to facilitate soldering.

18. A electric circuit device comprising the electronic part as claimed in claim 17, soldered to a circuit board.

19. An electronic part as set forth in claim 2, wherein said terminal portion is overcoated with a metal plated to facilitate soldering and said contact portion is overcoated with a metal plated to facilitate electrical contact.

20. A electric circuit device comprising the electronic part as claimed in claim 2, soldered to a circuit board.

* * * * *